United States Patent
Haight et al.

(10) Patent No.: US 11,145,801 B2
(45) Date of Patent: Oct. 12, 2021

(54) ADHESION LAYER TO ENHANCE ENCAPSULATION OF SUPERCONDUCTING DEVICES

(71) Applicant: International Business Machines Corporation, Armonk, NY (US)

(72) Inventors: Richard Alan Haight, Mahopac, NY (US); Ali Afzali-Ardakani, Ossining, NY (US); Vivekananda P. Adiga, Ossining, NY (US); Martin O. Sandberg, Ossining, NY (US); Hanhee Paik, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 143 days.

(21) Appl. No.: 16/681,295

(22) Filed: Nov. 12, 2019

(65) Prior Publication Data

US 2021/0143309 A1    May 13, 2021

(51) Int. Cl.
*H01L 39/02*    (2006.01)
*G06N 10/00*    (2019.01)
*H01L 39/24*    (2006.01)
*H01L 39/22*    (2006.01)

(52) U.S. Cl.
CPC .......... *H01L 39/025* (2013.01); *G06N 10/00* (2019.01); *H01L 39/223* (2013.01); *H01L 39/2493* (2013.01)

(58) Field of Classification Search
CPC . H01L 39/025; H01L 39/223; H01L 39/2493; G06N 10/00
See application file for complete search history.

(56) References Cited

U.S. PATENT DOCUMENTS

| 4,127,452 A | 11/1978 | Martens et al. |
| 4,965,244 A | 10/1990 | Weaver et al. |
| 5,155,094 A * | 10/1992 | Okabe .................. H01L 39/225 257/32 |
| 5,869,846 A * | 2/1999 | Higashino ............. H01L 39/225 257/31 |

(Continued)

FOREIGN PATENT DOCUMENTS

| CN | 1838439 A | 9/2006 |
| KR | 101142847 B1 | 5/2012 |
| WO | 2015067933 A1 | 5/2015 |

OTHER PUBLICATIONS

Appendix P: List of IBM Patents or Applications Treated as Related.
(Continued)

*Primary Examiner* — Shaun M Campbell
(74) *Attorney, Agent, or Firm* — Amin, Turocy & Watson, LLP

(57) ABSTRACT

Techniques regarding encapsulating one or more superconducting devices of a quantum processor are provided. For example, one or more embodiments described herein can regard a method that can comprise depositing an adhesion layer onto a superconducting resonator and a silicon substrate that are comprised within a quantum processor. The superconducting resonator can be positioned on the silicon substrate. Also, the adhesion layer can comprise a chemical compound having a thiol functional group.

25 Claims, 13 Drawing Sheets

(56) References Cited

U.S. PATENT DOCUMENTS

| | | | |
|---|---|---|---|
| 6,238,774 | B1 | 5/2001 | Park et al. |
| 6,506,814 | B2 | 1/2003 | Krongauz et al. |
| 8,189,980 | B2 | 5/2012 | Miyazaki et al. |
| 8,951,808 | B2 * | 2/2015 | Ladizinsky ......... H01L 39/2406 438/2 |
| 9,455,073 | B2 | 9/2016 | Barabash et al. |
| 9,971,970 | B1 | 5/2018 | Rigetti et al. |
| 10,208,148 | B2 | 2/2019 | Corten et al. |
| 10,403,808 | B2 | 9/2019 | Megrant |
| 2009/0181315 | A1 | 7/2009 | Spatz et al. |
| 2015/0017432 | A1 | 1/2015 | Shoseyov et al. |
| 2016/0221825 | A1 | 8/2016 | Allen et al. |
| 2016/0254434 | A1 | 9/2016 | McDermott, III et al. |
| 2019/0042964 | A1 | 2/2019 | Elsherbini et al. |
| 2019/0047258 | A1 | 2/2019 | Suematsu et al. |
| 2019/0164077 | A1 | 5/2019 | Roberts et al. |
| 2020/0364600 | A1 * | 11/2020 | Elsherbini ............. H01L 21/486 |

OTHER PUBLICATIONS

EP office action received for European Patent office application serial No. EP2020/081660 dated Jan. 12, 2021, 1 page.

International Search Report and Written Opinion for International Application No. PCT/EP2020/081660 dated Feb. 19, 2021, 12 pages.

Niemczyk, et al., Fabrication Technology of and Symmetry Breaking in Superconduction Quantum Circuits, arxiv.org, Cornell University Library, 201 Olin Library Cornell University Ithaca, NY 14853, Jan. 23, 2009 (Jan. 23, 2009), XP080358579, DOI: 10.1088/0953-2048/22/3/034009, p. 2, last paragraph—p. 9, line 1.

Non Final office action received for U.S Appl. No. 16/681,331 dated Feb. 2, 2021, 22 pages.

Kjaergaard, et al. "Superconducting Qubits: Current State of Play." arXiv:1905.13641v2 [quant-ph] Jul. 26, 2019. 28 pages.

* cited by examiner

ADHESION LAYER TO ENHANCE ENCAPSULATION OF SUPERCONDUCTING DEVICES

BACKGROUND

The subject disclosure relates to an adhesion layer comprising one or more thiol-based chemical compounds, and more specifically, to an adhesion layer that can enhance the metal fluoride encapsulation of one or more superconducting devises of a quantum processor.

Quantum processors can comprise a plurality of superconducting qubits connected to one or more superconducting resonators deposited on highly resistive substrate. Through appropriate device architecture and design, the lifetime of the wavefunction within the qubit has improved to several hundred microseconds, but additional increases in the lifetime of the wavefunction have not been realized. The wavefunction itself oscillates at a radio frequency ("RF") of about 5 gigahertz ("GHz"). At this frequency, absorption of RF photons within the oxides that form both during device fabrication, and extended presence in the atmosphere, can significantly impact the lifetime of the qubits. For example, oxide layers that forms on the surface of the substrate and and/or the superconducting resonator lines absorb strongly in the RF regime.

While the oxides can be removed via an etching treatment, regrowth of the oxides can occur rapidly in ambient atmosphere. Hence, a further encapsulation of the superconducting devices of the quantum processor can be implemented to inhibit development of the oxides and decrease RF absorption. Under the right conditions, deposition of a metal fluoride layer, a material that exhibits a loss tangent of about 1,000 times smaller than that of the oxide layers, can form a robust encapsulation of the superconducting devise and/or prevent further oxidation. However, the metal fluoride layer, at thin film coverage thicknesses, can form islands that leave part of the quantum processor exposed.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses and/or methods that can regard enhancing the metal fluoride encapsulation of one or more superconducting devices of a quantum processor are described.

According to an embodiment, a method is provided. The method can comprise depositing an adhesion layer onto a superconducting resonator and a silicon substrate that are comprised within a quantum processor. The superconducting resonator can be positioned on the silicon substrate. Also, the adhesion layer comprises a chemical compound having a thiol functional group. An advantage of such a method can be to enhance the adhesive properties of the quantum processor surface with regards to a metal fluoride coating.

In some examples, the method can further comprise removing a first oxide layer from the silicon substrate via an etching process. Also, the method can comprise removing a second oxide layer from the superconducting resonator via a process selected from the group consisting of an annealing process and the etching process. An advantage of such a method can be inhibiting the regrowth of oxides on the surface of the quantum processor deposition of the adhesion layer on the oxide-free superconducting devices.

According to an embodiment, another method is provided. The method can comprise depositing a chemical compound having a thiol functional group onto a surface of a silicon substrate and a surface of a superconducting resonator. The surface of the silicon substrate and the surface of the superconducting resonator can be oxide-free. An advantage of such a method can be utilization of the thiol functional group to facilitate adhesion with one or more metal fluoride layers for encapsulation of the superconducting resonator.

In some examples, the chemical compound is comprised within an adhesion layer that promotes adhesion between a metal fluoride coating and at least one surface selected from the group consisting of the surface of the silicon substrate and the surface of the superconducting resonator. An advantage of such a method can be the enablement of a uniform distribution of the metal fluoride coating over the silicon substrate and/or superconducting resonator.

According to an embodiment, another method is provided. The method can comprise preparing a surface of a quantum processor for adhesion with a metal fluoride coating by depositing a chemical compound having a thiol functional group onto a silicon substrate and a superconducting resonator of the quantum processor. An advantage of such a method can be reduced absorption of RF by the quantum processor due to at least the inhibition of one or more oxide layers within the quantum processor.

In some examples, preparing the surface can also comprise depositing the chemical compound onto a qubit of the quantum processor. Also, the method can further comprise removing a third oxide layer from the qubit via the etching process. An advantage of such a method can be facilitating the reduction in RF absorption through encapsulation of one or more qubits in combination with other superconducting devices, such as superconducting resonators.

According to an embodiment, an apparatus is provided. The apparatus can comprise an adhesion layer positioned on a superconducting resonator that can be located on a surface of a silicon substrate. The superconducting resonator and the silicon substrate can be comprised within a quantum processor. Also, the adhesion layer can comprise a chemical compound having a thiol functional group. An advantage of such an apparatus can be the enablement of enhanced adhesion with one or more metal fluorides that can inhibit RF absorption by the quantum processor.

In some examples, the apparatus can further comprise a metal fluoride layer that encapsulates the superconducting resonator. Also, the adhesion layer is between the metal fluoride layer and the superconducting resonator. An advantage of such an apparatus can be a uniform coating of the metal fluoride layer over the superconducting resonator such that RF absorption is reduced across the quantum processor.

According to an embodiment, another apparatus is provided. The apparatus can comprise an adhesion layer positioned between a superconducting resonator and a metal fluoride layer. The superconducting resonator can be positioned on a silicon substrate within a quantum processor. An advantage of such an apparatus can be enhancing adhesion between the metal fluoride and a surface of the quantum processor without increasing a required thickness of the metal fluoride coating.

In some examples, the chemical compound can be selected from the group consisting of 4-mercaptobenzoic acid, 4-aminothiophenol, and glycidopropanethiol. Also, the metal fluoride layer can comprise at least one member selected from the group consisting of calcium fluoride, lithium fluoride, manganese fluoride, iron fluoride, cobalt fluoride, nickel fluoride, and copper fluoride. An advantage of such an apparatus can be utilize one or more thiol functional groups of the adhesion layer to chemically interact with the metal fluoride layers to enhance adhesion with the quantum processor.

DETAILED DESCRIPTION

Figure 1:
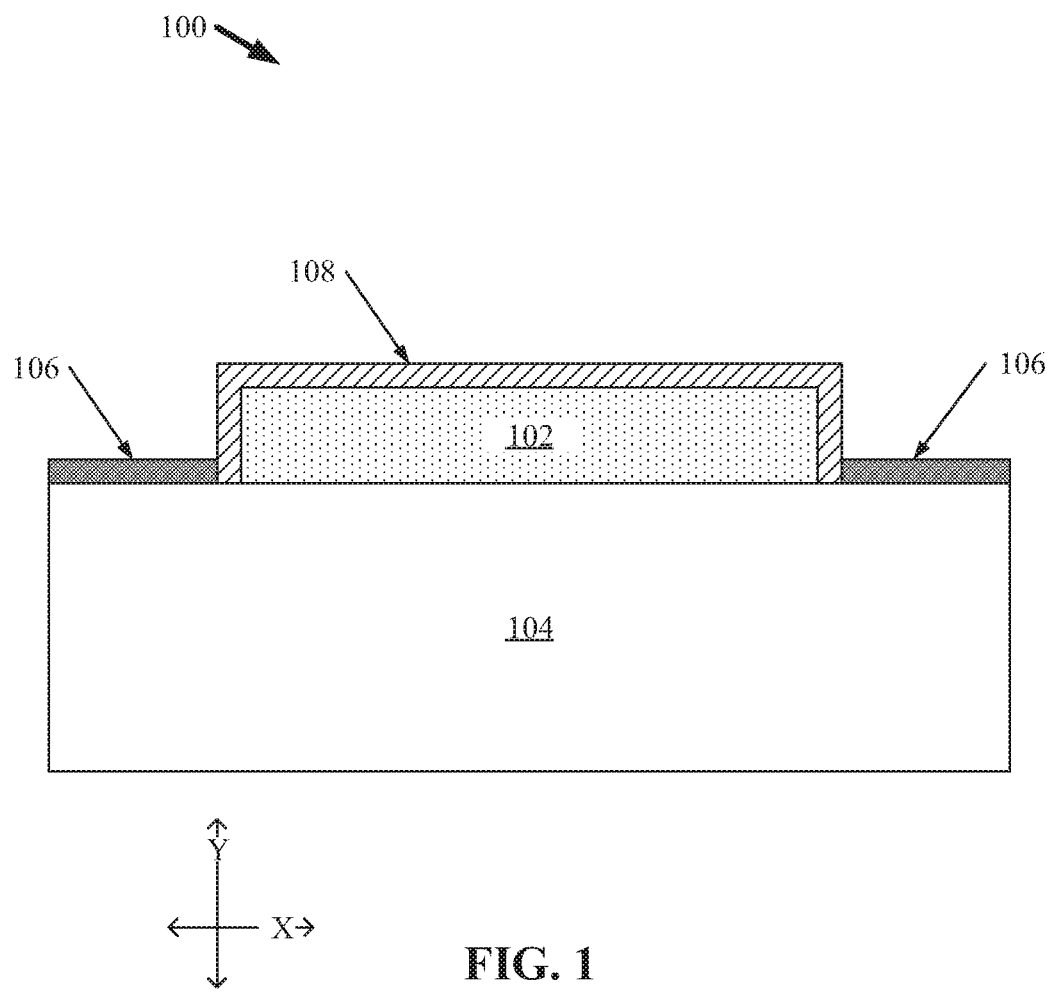
FIG. 1 illustrates a diagram of an example, non-limiting metal fluoride encapsulated quantum processor during a first stage of manufacturing in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the problems with other implementations of metal fluoride encapsulation of superconducting devices; the present disclosure can be implemented to produce a solution to one or more of these problems by incorporating an adhesion layer to enhance adhesion between a metal fluoride coating and one or more superconducting devices. Advantageously, one or more embodiments described herein can enhance the adhesion of one or more metal fluoride layers to a quantum processor. For example, one or more adhesion layers comprising a thiol-based chemical compound can be deposited over one or more oxide-free surfaces of a substrate, superconducting resonator, and/or qubit to facilitate subsequent adhesion to one or more metal fluoride layers that can coat the substrate, superconducting resonator, and/or qubit to encapsulate the quantum processor.

As described herein, the terms "deposition process" and/or "deposition processes" can refer to any process that grows, coats, deposits, and/or otherwise transfers one or more first materials onto one or more second materials. Example deposition processes can include, but are not limited to: physical vapor deposition ("PVD"), chemical vaper deposition ("CVD"), electrochemical deposition ("ECD"), atomic layer deposition ("ALD"), low-pressure chemical vapor deposition ("LPCVD"), plasma enhanced chemical vapor deposition ("PECVD"), high density plasma chemical vapor deposition ("HDPCVD"), sub-atmospheric chemical vapor deposition ("SACVD"), rapid thermal chemical vapor deposition ("RTCVD"), in-situ radical assisted deposition, high temperature oxide deposition ("HTO"), low temperature oxide deposition ("LTO"), limited reaction processing CVD ("LRPCVD"), ultrahigh vacuum chemical vapor deposition ("UHVCVD"), metalorganic chemical vapor deposition ("MOCVD"), physical vapor deposition ("PVD"), chemical oxidation, sputtering, plating, evaporation, spin-on-coating, ion beam deposition, electron beam deposition, laser assisted deposition, chemical solution deposition, a combination thereof, and/or the like.

As described herein, the terms "etching process", "etching process", "removal process", and/or "removal processes" can refer to any process that removes one or more first materials from one or more second materials. Example etching and/or removal processes can include, but are not limited to: wet etching, dry etching (e.g., reactive ion etching ("RIE")), chemical-mechanical planarization ("CMP"), a combination thereof, and/or the like.

As described herein the term "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials can be used in the various embodiments described herein.

FIG. 1 illustrates a diagram of an example, non-limiting quantum processor 100 during a first stage of manufacturing in accordance with one or more embodiments described herein. Repetitive description of like elements employed in other embodiments described herein is omitted for sake of brevity. As shown in FIG. 1, during the first stage of manufacturing, one or more superconducting resonators 102 can be deposited onto a silicon substrate 104 via one or more deposition processes. Additionally, in various embodiments, one or more qubits can be deposited onto the silicon substrate 104.

The one or more superconducting resonators 102 can extend across the silicon substrate 104 connecting one or more qubits. For example, the one or more superconducting resonators 102 can function as transmission lines for the quantum processor 100. Example materials that can comprise the one or more superconducting materials can include, but are not limited to: niobium (Nb), aluminum (Al), alloys thereof, a combination thereof, and/or the like. The one or more superconducting resonators 102 can have an exemplary thickness (e.g., along the "Y" direction shown in FIG. 1) that is greater than or equal to 0.5 nanometer (nm) and less than or equal to 1 micron. In various embodiments, the one or more superconducting resonators 102, and/or one or more qubits, can be positioned on highly resistive silicon of the silicon substrate 104. In some embodiments, the silicon substrate 104 can be a silicon-on-insulator ("SOI") or a silicon-on-sapphire ("SOS") wafer, wherein the one or more superconducting resonators 102, and/or one or more qubits, can be positioned on a silicon layer of the SOI wafer.

As shown in FIG. 1, one or more native oxide layers can be formed on one or more surfaces of the silicon substrate 104 and/or superconducting resonators 102. The one or more oxide layers can form from an interaction between the quantum processor 100 and the ambient environment. For example, one or more first oxide layers 106 can form on a device surface (e.g., the surface upon which the one or more superconducting resonators 102 and/or qubits can be located) of the silicon substrate 104. For instance, the one or more first oxide layers 106 can comprise silicon dioxide formed from an interaction between the silicon of the silicon substrate 104 and oxygen in the ambient environment. The one or more first oxide layers 106 can have an exemplary thickness (e.g., along the "Y" direction shown in FIG. 1) that is greater than or equal to 0.5 nm and less than or equal to 10 nm. Further, one or more second oxide layers 108 can form on one or more sides of the one or more superconducting resonators 102. For instance, wherein the one or more superconducting resonators 102 comprise niobium, the one or more second oxide layers 108 can comprise: niobium monoxide, niobium dioxide, niobium pentoxide, a combination thereof, and/or the like. The one or more second oxide layers 108 can have an exemplary thickness (e.g., along the "Y" direction shown in FIG. 1) that is greater than or equal to 0.5 nm and less than or equal to 10 nm (e.g., a thickness of 5 nm).

Figure 2:
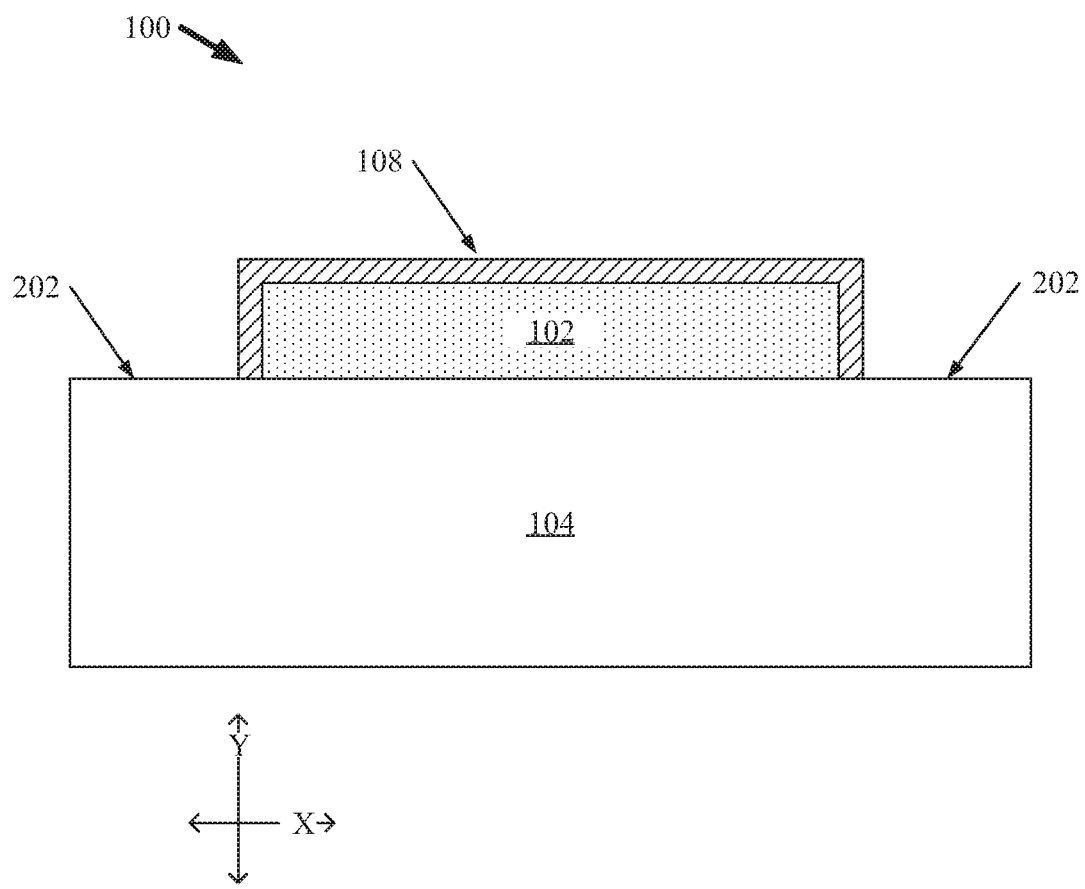
FIG. 2 illustrates a diagram of an example, non-limiting metal fluoride encapsulated quantum processor during a second stage of manufacturing in accordance with one or more embodiments described herein.

FIG. 2 illustrates a diagram of an example, non-limiting quantum processor 100 during a second stage of manufacturing in accordance with one or more embodiments described herein. Repetitive description of like elements employed in other embodiments described herein is omitted for sake of brevity. As shown in FIG. 2, during the second stage of manufacturing, the one or more first oxide layers 106 can be removed from the silicon substrate 104 via one or more etching processes. For example, one or more silicon dioxide layers can be removed from the device surface of the silicon substrate 104 to define one or more oxide-free surfaces 202 of the quantum processor 100.

In one or more embodiments, the one or more first oxide layers 106 can be removed from the silicon substrate 104 using a hydrofluoric acid ("HF") or trifluoroacetic acid ("TFA") solution in one or more etching processes. For example, the quantum processor 100 can be dipped into an etching solution comprising 10% HF for a period of time that is, for instance, greater than or equal to 10 seconds and less than or equal to 1 minute. The one or more etching processes (e.g., utilizing a dilute HF or TFA solution) can remove the one or more first oxide layers 106 (e.g., silicon dioxide layers), wherein hydrogen can further terminate on the surface of the silicon substrate 104 and inhibit re-growth of the one or more first oxide layers 106 for a period of time (e.g., for several minutes). Thereby, the one or more etching processes can render an oxide-free surface 202 of the silicon substrate 104.

In some embodiments, the one or more first oxide layers 106 can be removed from the silicon substrate 104 via one or more annealing processes. For instance, the quantum processor 100, including the silicon substrate 104, can be heated to a temperature greater than or equal to 250 degrees Celsius (° C.) and less than or equal to 480° C. The annealing process can remove the one or more first oxide layers 106 (e.g., comprising silicon oxide) without damaging the one or more superconducting resonators 102 and/or qubits of the quantum processor 100. Additionally, the annealing process can remove water deposited onto the quantum processor 100 from the ambient environment.

Figure 3:
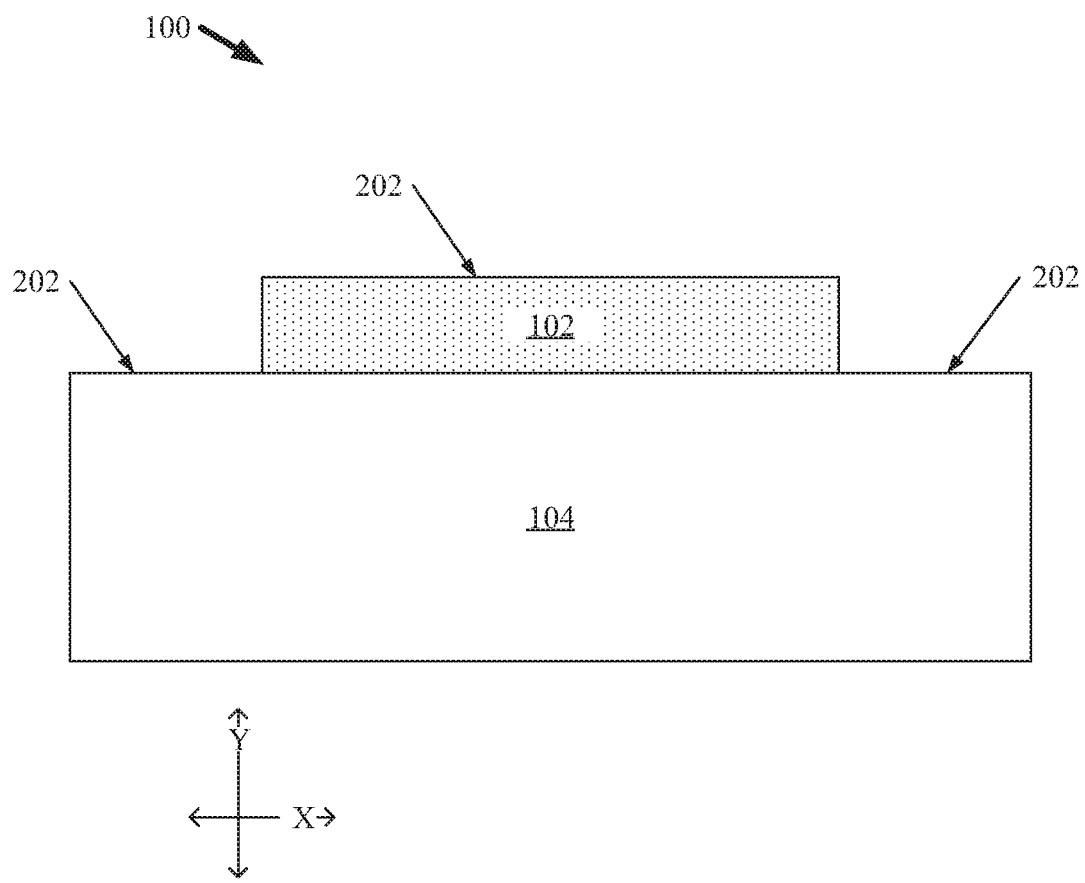
FIG. 3 illustrates a diagram of an example, non-limiting metal fluoride encapsulated quantum processor during a third stage of manufacturing in accordance with one or more embodiments described herein.

FIG. 3 illustrates a diagram of an example, non-limiting quantum processor 100 during a third stage of manufacturing in accordance with one or more embodiments described herein. Repetitive description of like elements employed in other embodiments described herein is omitted for sake of brevity. As shown in FIG. 3, during the third stage of manufacturing, the one or more second oxide layers 108 can be removed from the one or more superconducting resonators 102 via one or more etching processes and/or annealing processes. For example, one or more niobium oxide layers can be removed from one or more surfaces of the one or more superconducting resonators 102 to further define one or more oxide-free surfaces 202 of the quantum processor 100.

In one or more embodiments, the one or more second oxide layers 108 can be removed during the same etching process that removes the one or more first oxide layers 106. For example, the one or more second oxide layers 108 can be removed during etching by the diluted HF etching solution that can remove the one or more first oxide layers 106. Further, the etching process can be performed within a nitrogen glove box having an oxygen partial pressure of about 1 part per million so as to inhibit regrowth of the one or more second oxide layers 108 on the one or more superconducting resonators 102. In various embodiments, the etching process can further remove one or more oxide layers (e.g., niobium oxides) from one or more qubits of the quantum processor 100 (e.g., which can be coupled to the one or more superconducting resonators 102 and/or positioned on the silicon substrate 104).

In one or more embodiments, the one or more second oxide layers 108 can be removed via an annealing process (e.g., performed after the etching process that can remove the one or more first oxide layers 106). For example, following the etching process that removes the one or more first oxide layers 106, the quantum processor 100 can be inserted into a vacuum system where regrowth of the one or more first oxide layers 106 can be prevented. Further, the quantum processor 100 can be annealed within the vacuum system for a period of time (e.g., a period of time less than or equal to 1 minute). For instance, the quantum processor 100, including the one or more superconducting resonators 102, can be heated to a temperature greater than or equal to 250 degrees Celsius (° C.) and less than or equal to 480° C. The annealing process can remove the one or more second oxide layers 108 (e.g., comprising niobium pentoxide) without damaging the one or more superconducting resonators 102 and/or qubits of the quantum processor 100. Additionally, the annealing process can remove water deposited onto the quantum processor 100 from the ambient environment.

In various embodiments, the quantum processor 100 can be subject to one or more etching processes and annealing processes in accordance with the embodiments described herein. For example, the one or more first oxide layers 106 can be removed via one or more etching and/or annealing processes, which can also remove the one or more second oxide layers 108. In another example, the one or more first oxide layers 106 can be removed via one or more etching and/or annealing processes, wherein the one or more second oxide layers 108 can be removed via one or more other etching and/or annealing processes. As a result of the one or more etching processes and/or annealing processes, a device surface of the quantum processor 100 (e.g., comprising the silicon substrate 104, the one or more superconducting resonators 102, and/or the one or more qubits) can be rendered an oxide-free surface 202 (e.g., as shown in FIG. 3).

The one or more native oxide layers (e.g., first oxide layers 106 and/or second oxide layers 108) can strongly absorb RF energy at 5 GHz, which can be the resonate frequency of the quantum processor 100. Once the oxide layers are removed, RF is no longer absorbed by the oxides and the quality factor ("Q") of the one or more superconducting resonators 102 can be increase; thereby increasing the relaxation times ("T1" and/or "T2") of the quantum processor's 100 qubit wavefunction.

Figure 4:
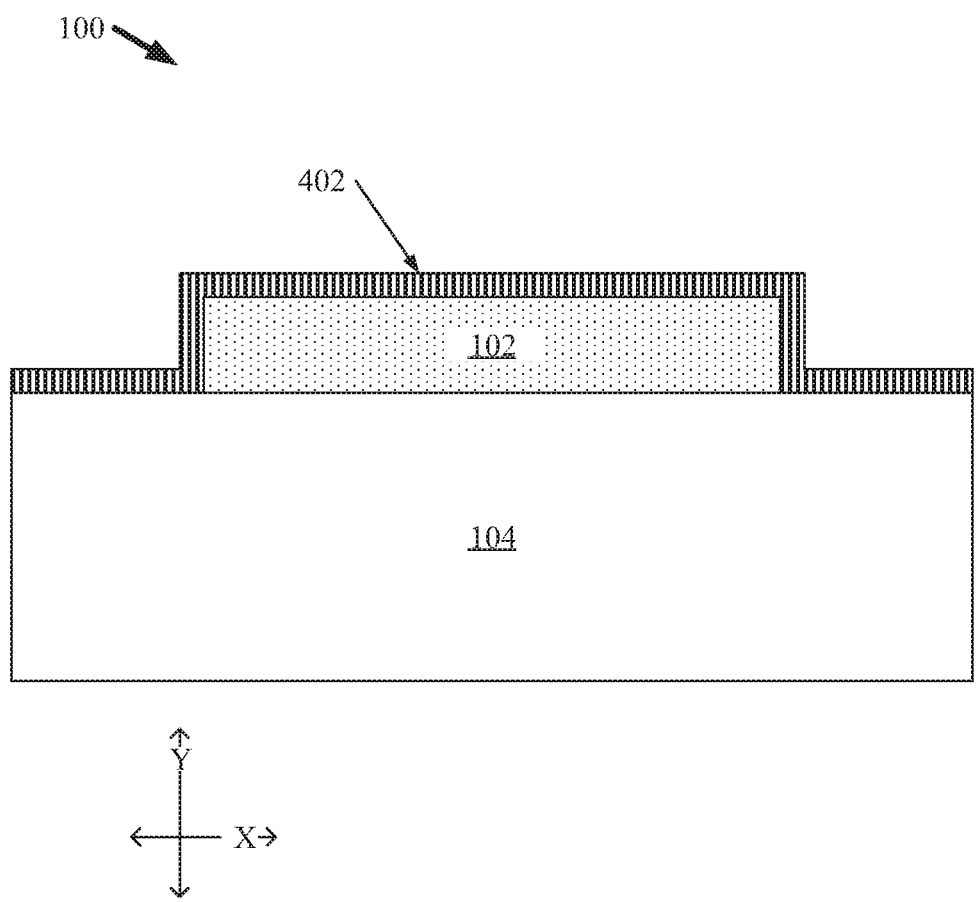
FIG. 4 illustrates a diagram of an example, non-limiting metal fluoride encapsulated quantum processor during a fourth stage of manufacturing in accordance with one or more embodiments described herein.

FIG. 4 illustrates a diagram of an example, non-limiting quantum processor 100 during a fourth stage of manufacturing in accordance with one or more embodiments described herein. Repetitive description of like elements employed in other embodiments described herein is omitted for sake of brevity. As shown in FIG. 4, during the fourth stage of manufacturing, one or more adhesion layers 402 can be deposited onto the one or more oxide-free surfaces 202 of the quantum processor 100.

For example, the one or more adhesion layers 402 can be deposited onto the silicon substrate 104, the one or more superconducting resonators 102, and/or the one or more qubits. For instance, the one or more adhesion layers 402 can be deposited onto surfaces of the quantum processor 100 where oxide layers (e.g., one or more first oxide layers 106 and/or second oxide layers 108) were removed via one or more etching and/or annealing processes. In one or more embodiments, the one or more adhesion layers 402 can encapsulate the one or more superconducting resonators 102 and/or qubits on the silicon substrate 104.

In various embodiments, the one or more adhesion layers 402 can comprise one or more organic chemical compounds having one or more thiol functional groups. Example thiol-based chemical compounds that can be comprised within the one or more adhesion layers 402 can include, but are not limited to: 4-mercaptobenzoic acid ("MBA"), 4-aminothiophenol, glycidopropanethiol, a combination thereof, and/or the like. The one or more thiol-based chemical compounds of the one or more adhesion layers 402 can comprise a thiol end group that can adhere to the oxide-free surfaces 202 of the quantum processor 100. Further, in one or more embodiments, the deposition at the fourth stage of manufacturing can deposit a monolayer of the organic thiol-based chemical compound. The one or more adhesion layers 402 can prevent re-oxidation of the components of the quantum processor 100 (e.g., the silicon substrate 104, superconducting resonators 102, and/or qubits) and/or enhance the adhesion of one or more subsequent layers to be deposited onto the quantum processor 100.

Figure 5:
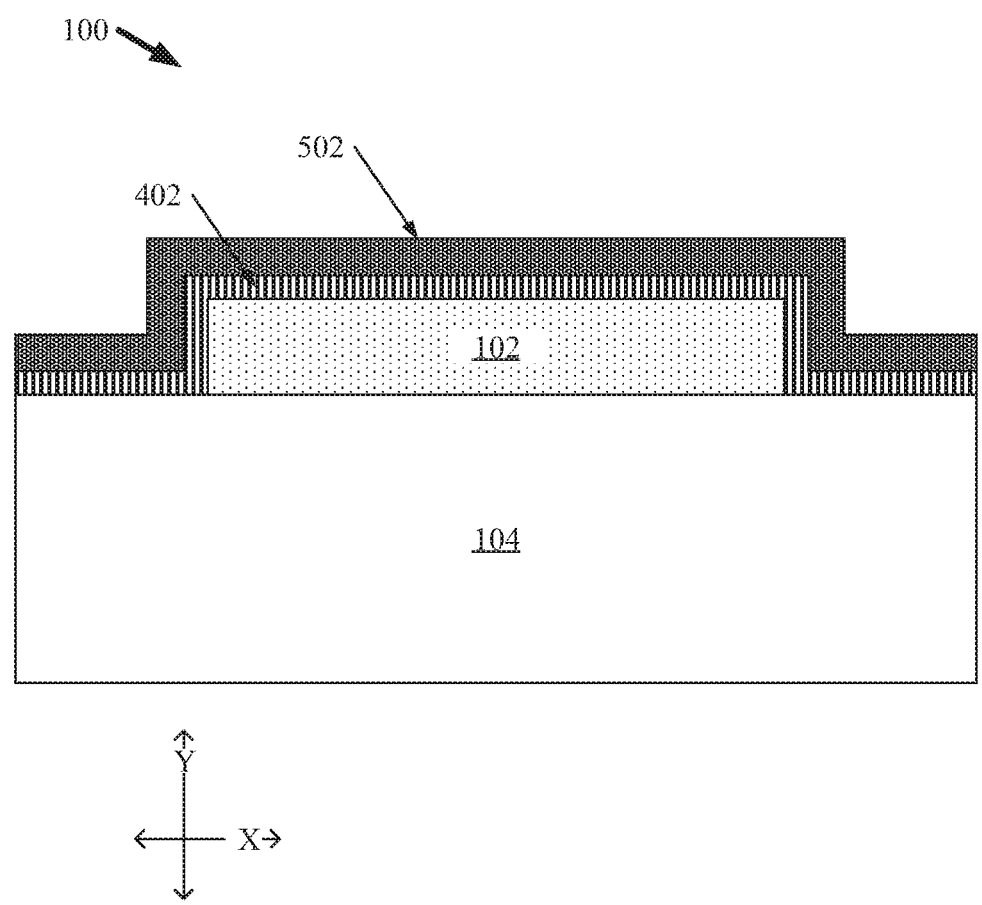
FIG. 5 illustrates a diagram of an example, non-limiting metal fluoride encapsulated quantum processor comprising an adhesion layer that can enhance adhesion between a metal fluoride coating and a surface of the quantum processor in accordance with one or more embodiments described herein.

FIG. 5 illustrates a diagram of an example, non-limiting quantum processor 100 during a fifth stage of manufacturing in accordance with one or more embodiments described herein. Repetitive description of like elements employed in other embodiments described herein is omitted for sake of brevity. As shown in FIG. 5, during the fifth stage of manufacturing, one or more metal fluoride layers 502 can be deposited onto the one or more adhesion layers 402 via one or more deposition processes.

For example, the one or more metal fluoride layers 502 can be deposited onto the one or more adhesion layers 402 via thermal evaporation. For instance, the one or more metal fluoride layers 502 can evaporate congruently (e.g., evaporating or subliming as a molecule). In various embodiments, the one or more metal fluoride layers 502 can be deposited, via one or more deposition processes (e.g., thermal evaporation), onto the one or more adhesion layers 402 within a vacuum system (e.g., wherein the vacuum system can prevent regrowth of one or more oxide layers). Example materials that can comprise the one or more metal fluoride layers 502 can include, but are not limited to: calcium fluoride, lithium fluoride, manganese fluoride, iron fluoride, cobalt fluoride, nickel fluoride, copper fluoride, a combination thereof, and/or the like. Additionally, the one or more metal fluoride layers 502 can have an exemplary thickness (e.g., along the "Y" direction shown in FIG. 5) that is greater than or equal to 1 nanometer (nm) and less than or equal to 30 nm. In various embodiments, the one or more metal fluoride layers 502 can: encapsulate the one or more superconducting resonators 102, encapsulate one or more qubits of the quantum processor 100, coat the oxide-free surface 202 of the silicon substrate 104, inhibit regrowth of one or more oxide layers (e.g., the one or more first oxide layers 106 and/or second oxide layers 108), reduce absorption of RF by the quantum processor 100 (e.g., via the one or more encapsulations and/or coatings), and/or a combination thereof.

In one or more embodiments, the one or more adhesion layers 402 can facilitate achieving a continuous, or near continuous, coating of the one or more metal fluoride layers 502. For example, x-ray photoelectron spectroscopy of the quantum processor 100, wherein the one or more metal fluoride layers 502 comprise calcium fluoride, can show near complete suppression of the silicon 2p core level following 10 nm of calcium fluoride, which can indicate substantial coverage of the one or more superconducting resonators 102. Additionally, the x-ray photoelectron spectroscopy can depict that the niobium 3d core level dramatically reduced upon the utilization of the one or more adhesion layers (e.g., "MBA"), which can indicate substantially improved surface coverage of the metal fluoride layers 502 (e.g., as compared to manufacturing methods where the adhesion layers 402 are absent). Thus, the one or more adhesion layers 402 can enhance an adhesion of the one or more metal fluoride layers 502 to the oxide-free surfaces 202 of the silicon substrate 104, one or more superconducting resonators 102, and/or qubits. Also, the one or more adhesion layers 402 can enable a uniform, or substantially uniform, growth of the of one or more metal fluoride layers 502 on the quantum processor 100.

In various embodiments, the one or more metal fluoride layers 502 can be characterized by an absorption value of 5 GHz RF that is up to about 1,000 times weaker than that of the one or more oxide layers (e.g., first oxide layers 106 and/or second oxide layers 108) native to the quantum processor 100 (e.g., formed via interaction with the ambient environment). Additionally, in some embodiments the one or more metal fluoride layers 502 (e.g., such as calcium fluoride) can be water insoluble, impermeable to atmospheric gases, and/or can resist oxidation in an ambient environment surrounding the quantum processor 100. Thereby, removal of the native oxides (e.g., one or more first oxide layers 106 and/or second oxide layers 108) and encapsulation of the one or more superconducting resonators 102 (e.g., with the one or more adhesion layers 402 and/or metal fluoride layers 502) can increase the quality factor of the one or more superconducting resonators 102 and/or thereby improve operation of the one or more qubits.

Figure 6:
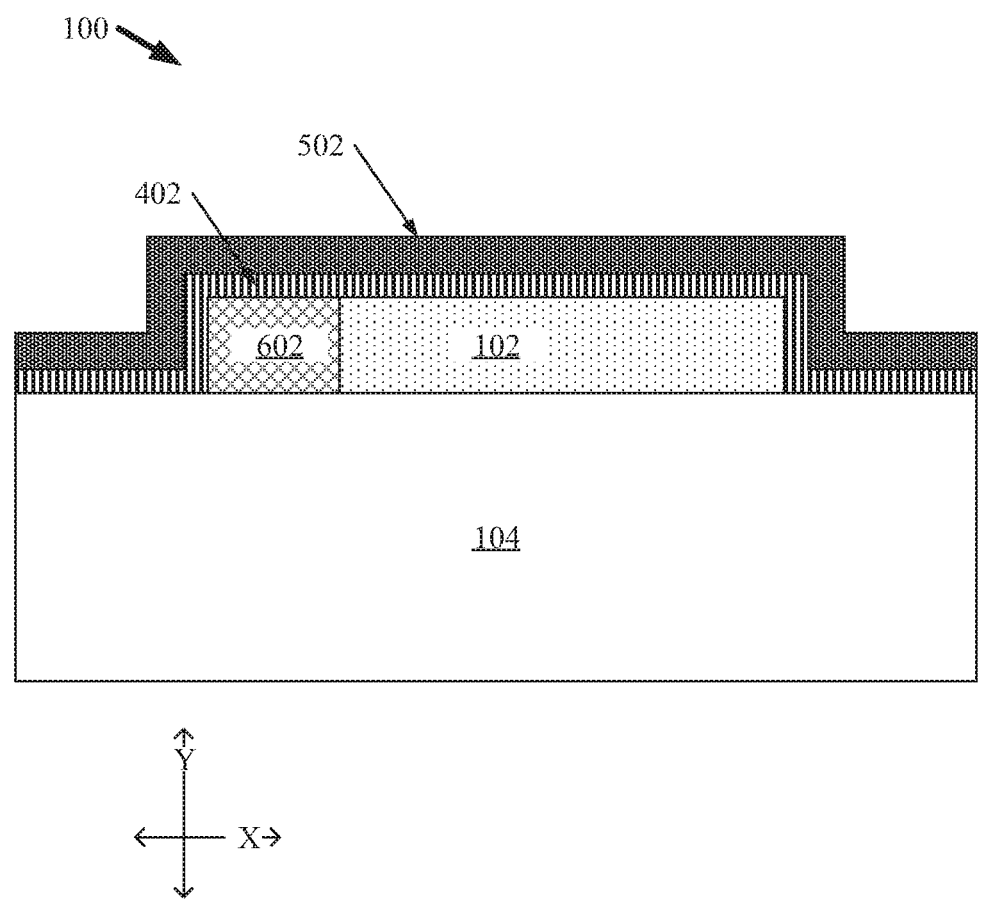
FIG. 6 illustrates a diagram of an example, non-limiting metal fluoride encapsulated quantum processor comprising an adhesion layer that can enhance adhesion between a metal fluoride coating and a surface of the quantum processor in accordance with one or more embodiments described herein.

FIG. 6 illustrates a diagram of an example, non-limiting quantum processor 100 during the fifth stage of manufacturing and comprising one or more superconducting qubits 602 in accordance with one or more embodiments described herein. Repetitive description of like elements employed in other embodiments described herein is omitted for sake of brevity. As shown in FIG. 6, the quantum processor 100 can comprise one or more superconducting qubits 602, which can comprise one or more Josephson junctions positioned on the silicon substrate 104 and/or operably coupled to the one or more superconducting resonators 102.

In various embodiments, one or more oxides can be removed from the one or more superconducting qubits 602 (e.g., via the second and/or third stages of manufacturing described herein), the one or more adhesion layers 402 can be further deposited onto the one or more superconducting qubits 602 (e.g., via the fourth stage of manufacturing described herein), and/or the one or more metal fluoride layers 502 can be further deposited over the one or more superconducting qubits 602 (e.g., via the fifth stage of manufacturing described herein, as shown in FIG. 6). Thereby, the one or more adhesion layers 402 and/or metal fluoride layers 502 can further encapsulate the one or more superconducting qubits 602 on the silicon substrate 104.

Figure 7:
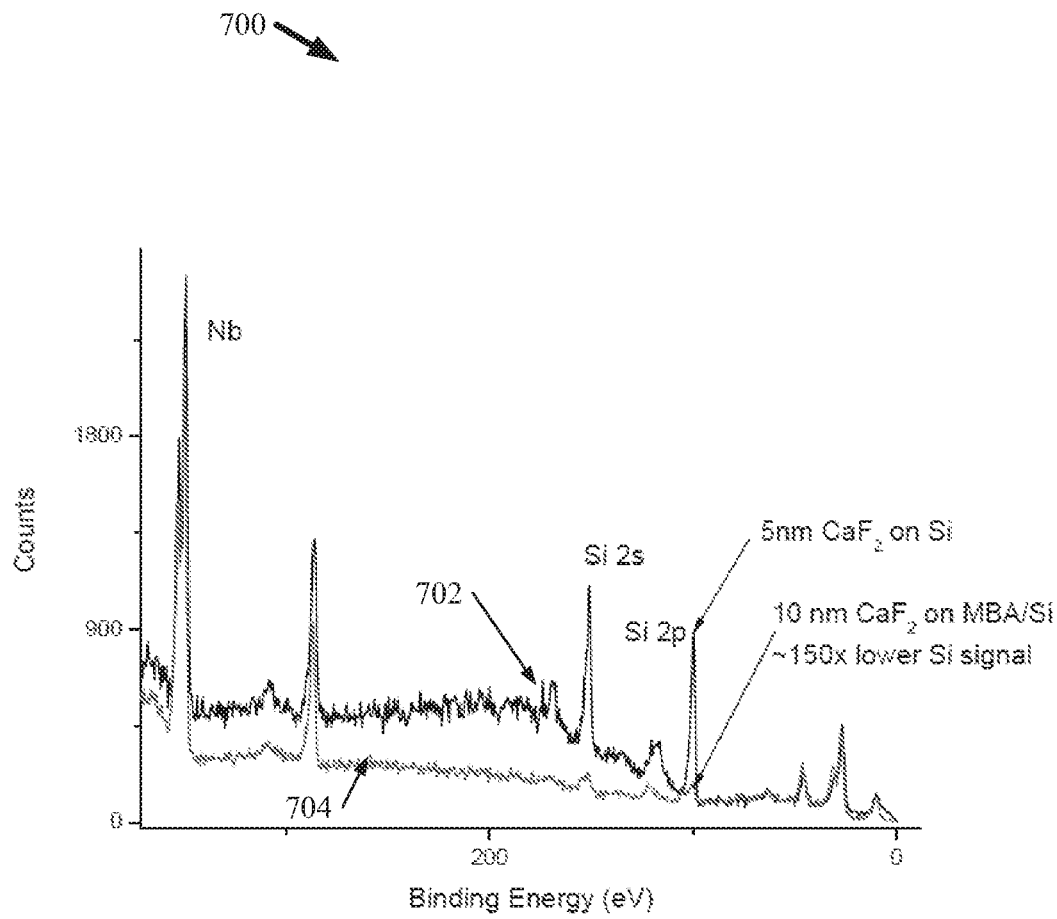
FIG. 7 illustrates a diagram of an example, non-limiting graph that can depict enhanced adhesion properties between a surface of a quantum processor and a metal fluoride coating that can be facilitated by one or more thiol-based adhesion layers in accordance with one or more embodiments described herein.

FIG. 7 illustrates a diagram of an example, non-limiting graph 700 that can depict the efficacy of implementing one or more adhesion layers 402 to enhance adhesion of the one or more metal fluoride layers 502 to the oxide-free surfaces 202 of the quantum processor 100 in accordance with one or more embodiments described herein. Repetitive description of like elements employed in other embodiments described herein is omitted for sake of brevity. As shown in FIG. 7, a first line 702 can characterize a metal-fluoride encapsulated quantum processor comprising a 5 nm thick layer of calcium fluoride. Also shown in FIG. 7, a second line 704 can characterize an embodiment of the quantum processor 100 having a 10 nm thick encapsulation comprising calcium fluoride and MBA.

Graph 700 can show a comparison of calcium fluoride (e.g., 5 nm thick) deposited directly onto the silicon substrate 104 and calcium fluoride (e.g., 10 nm thick) deposited on a monolayer of MBA. The silicon 2p core level can be evident in the first line 702, thereby indicating incomplete coverage of the calcium fluoride coating. In contrast, the second line 704 demonstrates that the incorporation of the MBA monolayer can reduce the silicon 2p core level by more than 150 times. Given the 2 nm mean-free-path of the photoelectrons from the Si 2p core level, a small residual peak can be expected for a uniform layer of the calcium fluoride. The experimental evidence depicted in graph 700 can indicate that the MBA monolayer can enable the calcium fluoride to grow (e.g., uniformly) on the silicon substrate 104.

Figure 8A:
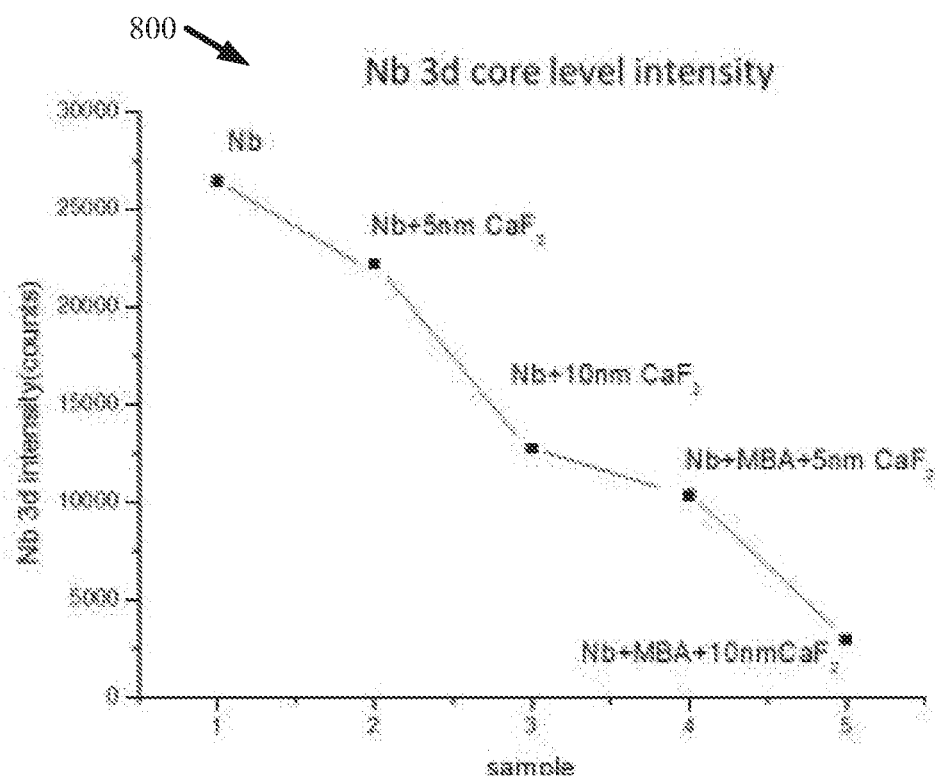
FIG. 8A illustrates a diagram of an example, non-limiting graph that can depict the integrated niobium core level intensity of superconducting resonators plotted as a function of treatment for five different encapsulation conditions in accordance with one or more embodiments described herein.
Figure 8B:
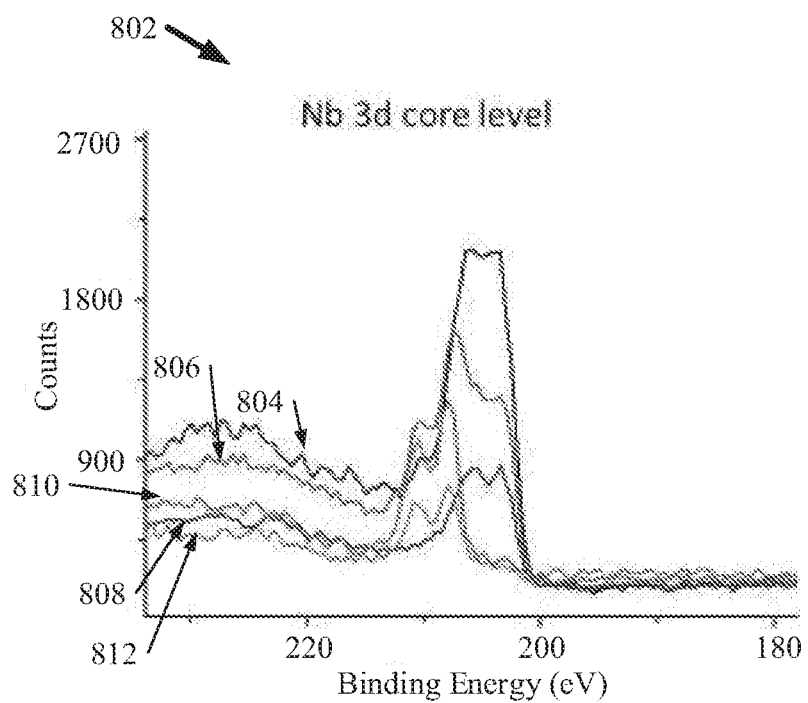
FIG. 8B illustrates a diagram of an example, non-limiting graph that can depict the niobium core levels of superconducting resonators characterized by native oxide states and/or metal fluoride encapsulations in accordance with one or more embodiments described herein. FIG

FIGS. 8A and/or 8B illustrate diagrams of example, non-limiting graphs 800 and/or 802 that can further depict the efficacy of implementing one or more adhesion layers 402 to enhance adhesion of the one or more metal fluoride layers 502 to the oxide-free surfaces of the quantum processor 100 in accordance with one or more embodiments described herein. Repetitive description of like elements employed in other embodiments described herein is omitted for sake of brevity. FIG. 8A depicts the integrated niobium core level intensity of the one or more superconducting resonators 102 plotted as a function of treatment for five different conditions showing a continual improvement in metal fluoride (e.g., calcium fluoride) coverage following oxide removal and adhesion layer 402 (e.g., MBA) deposition. FIG. 8B shows niobium 3d core levels from the niobium of one or more superconducting resonators 102 with its native oxide (e.g., represented by third line 804) and subsequent cases in which the oxide has been thermally removed and the superconducting resonator 102 has been covered with 5 nm of calcium fluoride (e.g., represented by fourth line 806), 10 nm of calcium fluoride (e.g., represented by fifth line 808), 5 nm of calcium fluoride with MBA (e.g., represented by sixth line 810), and/or 10 nm of calcium fluoride with MBA (e.g., represented by seventh line 812).

Figure 9A:
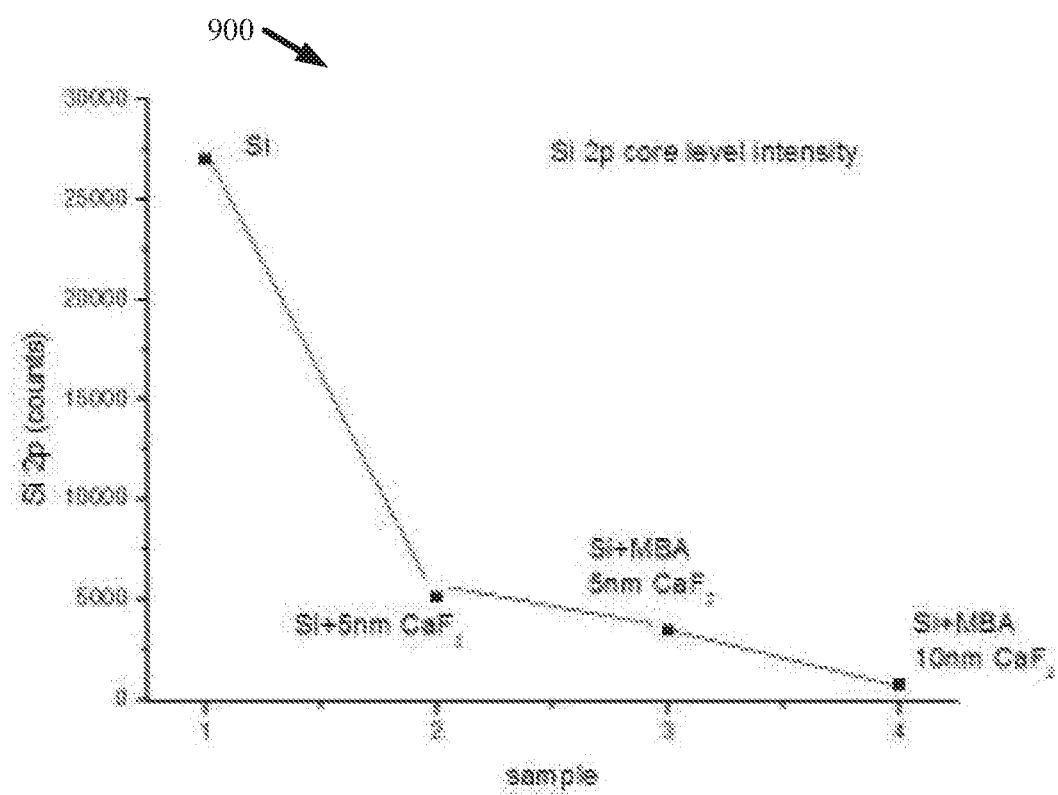
FIG. 9A illustrates a diagram of an example, non-limiting graph that can depict the integrated silicon core level intensity of substrates plotted as a function of treatment for five different encapsulation conditions in accordance with one or more embodiments described herein.
Figure 9B:
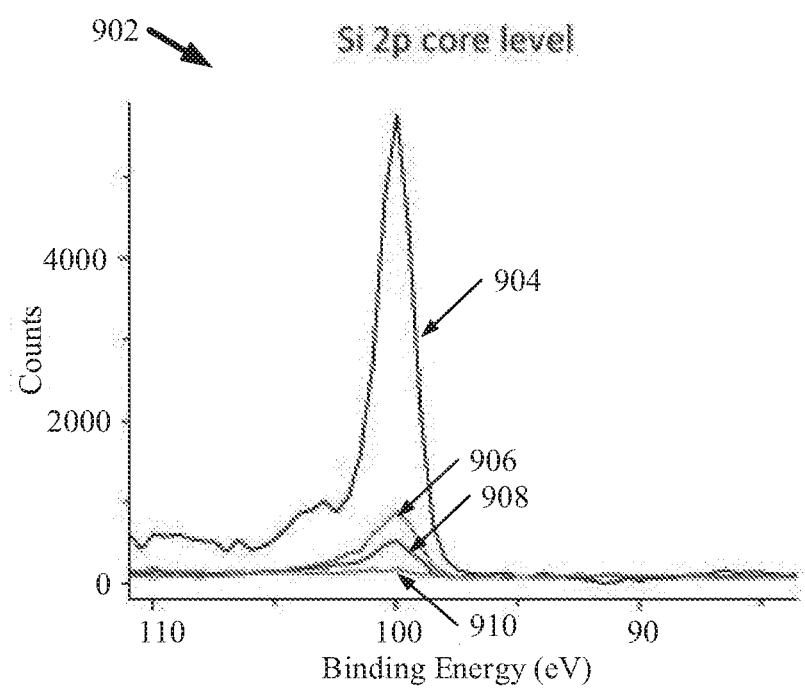
FIG. 9B illustrates a diagram of an example, non-limiting graph that can depict the silicon core levels of substrates characterized by native oxide states and/or metal fluoride encapsulations in accordance with one or more embodiments described herein.

FIGS. 9A and/or 9B illustrate diagrams of example, non-limiting graphs 900 and/or 902 that can further depict the efficacy of implementing one or more adhesion layers 402 to enhance adhesion of the one or more metal fluoride layers 502 to the oxide-free surfaces of the quantum processor 100 in accordance with one or more embodiments described herein. Repetitive description of like elements employed in other embodiments described herein is omitted for sake of brevity. FIG. 9A depicts the integrated silicon core level intensity of the silicon substrate 104 plotted as a function of treatment for four different conditions showing a continual improvement in metal fluoride (e.g., calcium fluoride) coverage following oxide removal and adhesion layer 402 (e.g., MBA) deposition. FIG. 9B shows silicon 2p core levels from the silicon substrate 104 with its native oxide (e.g., represented by eighth line 904) and subsequent cases in which the oxide has been thermally removed and the silicon substrate has been covered with 5 nm of calcium fluoride (e.g., represented by ninth line 906), 5 nm of calcium fluoride with MBA (e.g., represented by tenth line 908), and/or 10 nm of calcium fluoride with MBA (e.g., represented by eleventh line 910).

Figure 10:
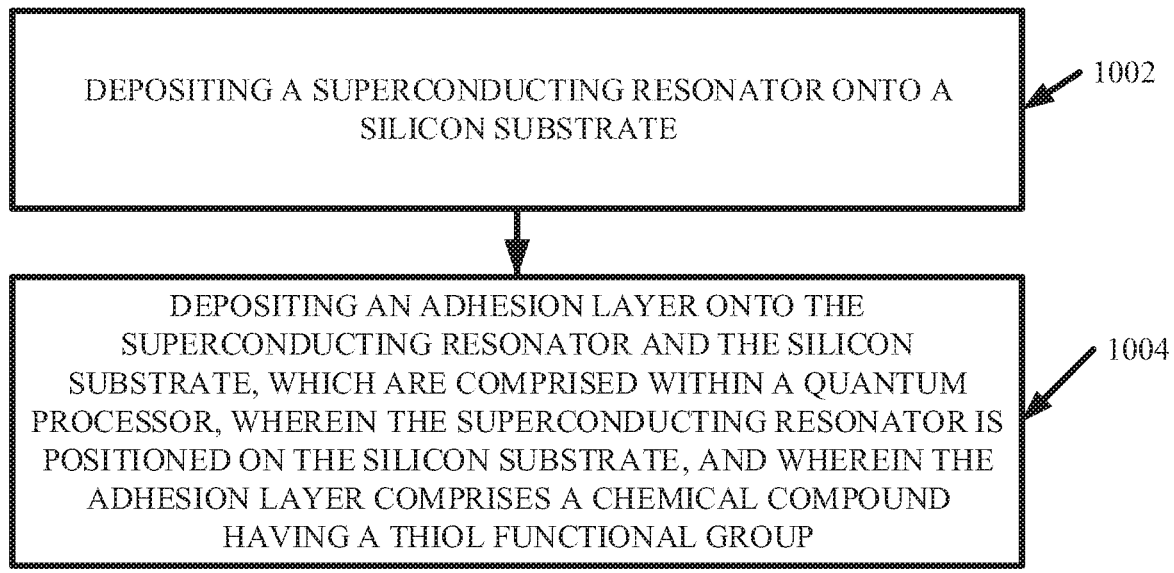
FIG. 10 illustrates a flow diagram of an example, non-limiting method that can facilitate manufacturing one or more metal fluoride encapsulated quantum processors in accordance with one or more embodiments described herein.

FIG. 10 illustrates a flow diagram of an example, non-limiting method 1000 that can facilitate manufacturing one or more quantum processors 100 that can comprise one or more adhesion layers 402 that can facilitate one or more superconducting device encapsulations with metal fluoride in accordance with one or more embodiments described herein. Repetitive description of like elements employed in other embodiments described herein is omitted for sake of brevity.

At 1002, the method 1000 can comprise depositing one or more superconducting resonators 102 onto a silicon substrate 104. As described herein, the one or more superconducting resonators 102 and/or the silicon substrate 104 can be comprised within a quantum processor 100. Further, one or more superconducting qubits 602 (e.g., comprising one or more Josephson junctions) can be positioned on the silicon substrate 104 and/or coupled to the one or more superconducting resonators 102. In various embodiments, the one or more superconducting resonators 102 can traverse a device surface of the silicon substrate 104 connecting one or more of the superconducting qubits 602.

At 1004, the method 1000 can comprise depositing one or more adhesion layers 402 onto the one or more superconducting resonators 102 and/or the silicon substrate 104, which can be comprised within the quantum processor 100, wherein the one or more superconducting resonators 102 can be positioned on the silicon substrate 104, and wherein the one or more adhesion layers 402 can comprise a chemical compound having a thiol functional group. In accordance with various embodiments described herein, the surface of the quantum processor 100 upon which the one or more adhesion layers 402 are deposited can be oxide-free (e.g., oxide-free surface 202). Further, the one or more chemical compounds of the one or more adhesion layers 402 can comprise one or more thiol end groups that can adhere to the oxide-free surface 202 of the quantum processor 100. Example chemical compounds that can be comprised within the one or more adhesion layers 402 can include, but are not limited to: MBA, 4-aminothiophenol, glycidopropanethiol, a combination thereof, and/or the like.

In various embodiments, the one or more adhesion layers 402 can enhance an adhesion between one or more components of the quantum processor 100 (e.g., the silicon substrate 104, the one or more superconducting resonators 102, and/or the one or more superconducting qubits 602) and a metal fluoride coating. For instance, the metal fluoride coating can prevent the regrowth of one or more oxides on the quantum processor 100, and/or the one or more adhesion layers 402 can enable uniform, or near uniform, distribution of the metal fluoride coating across the quantum processor 100, as described herein.

Figure 11:
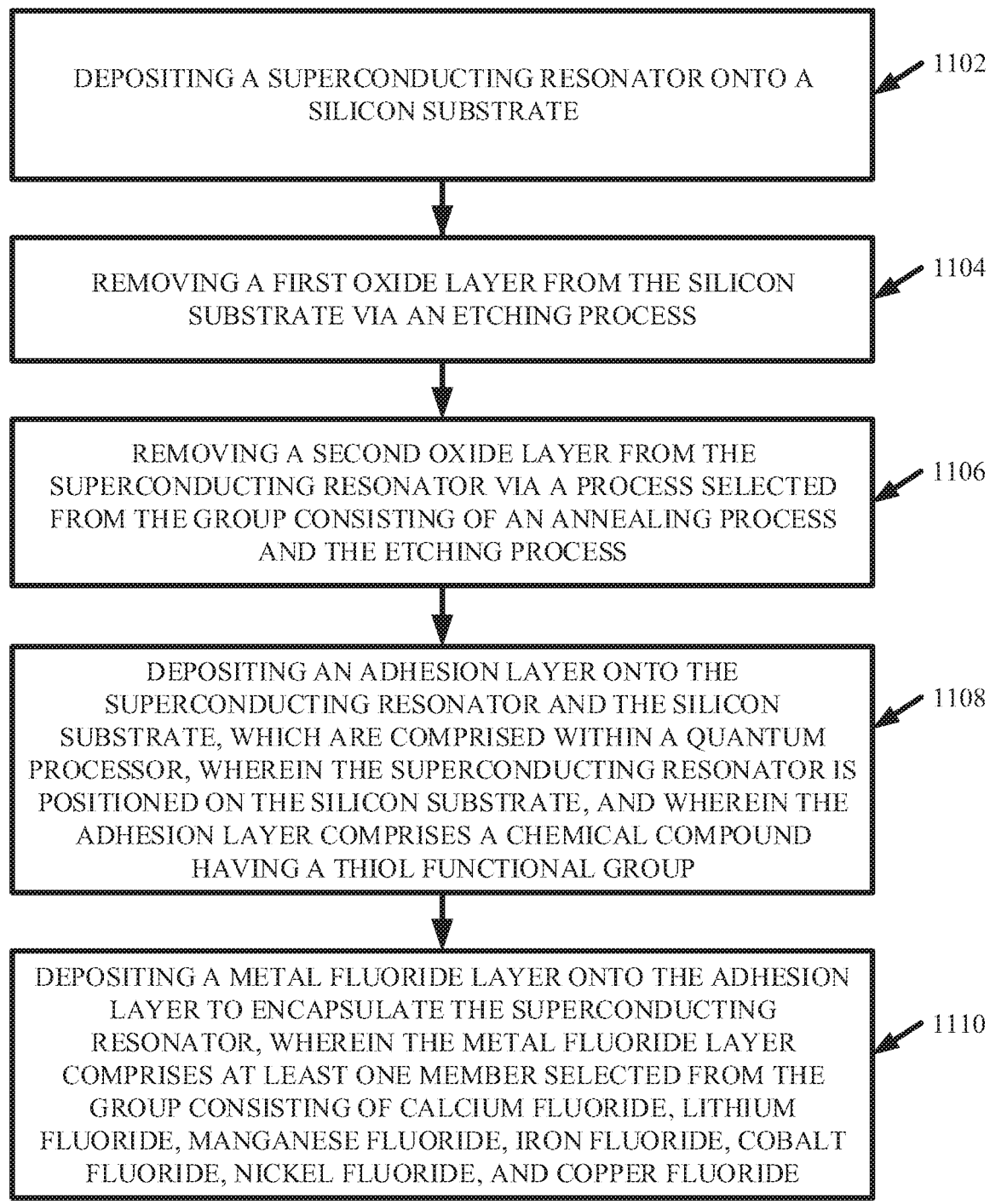
FIG. 11 illustrates a flow diagram of an example, non-limiting method that can facilitate manufacturing one or more metal fluoride encapsulated quantum processors in accordance with one or more embodiments described herein.

FIG. 11 illustrates a flow diagram of an example, non-limiting method 1100 that can facilitate manufacturing one or more quantum processors 100 that can comprise one or more adhesion layers 402 that can facilitate one or more superconducting device encapsulations with metal fluoride in accordance with one or more embodiments described herein. Repetitive description of like elements employed in other embodiments described herein is omitted for sake of brevity.

At 1102, the method 1100 can comprise depositing one or more superconducting resonators 102 onto a silicon substrate 104. As described herein, the one or more superconducting resonators 102 and/or the silicon substrate 104 can be comprised within a quantum processor 100. Further, one or more superconducting qubits 602 (e.g., comprising one or more Josephson junctions) can be positioned on the silicon substrate 104 and/or coupled to the one or more superconducting resonators 102. In various embodiments, the one or more superconducting resonators 102 can traverse a device surface of the silicon substrate 104 connecting one or more of the superconducting qubits 602. For example, the depositing at 1102 can be performed in accordance with the first stage of manufacturing described herein.

At 1104, the method 1100 can comprise removing one or more first oxide layers 106 from the silicon substrate 104 via one or more etching processes. For example, removing the one or more first oxide layers 106 at 1104 can be performed in accordance with the second stage of manufacturing described herein. For instance, the one or more first oxide layers 106 can comprise silicon oxide and/or can be removed using a solution of dilute HF and/or TFA. In some embodiments, the one or more first oxide layers 106 can be removed via an annealing processes that heats the quantum processor 100 to a temperature that is greater than or equal to 250° C. and less than or equal to 480° C. Removal of the one or more first oxide layers 106 can define one or more oxide-free surfaces 202 on the quantum processor 100.

At 1106, the method 1100 can comprise removing one or more second oxide layers 108 from the one or more superconducting resonators 102 via a process selected from the group consisting of an annealing process and/or the etching process. For example, removing the one or more second oxide layers 108 at 1106 can be performed in accordance with the third stage of manufacturing described herein. For instance, the one or more second oxide layers 108 can comprise one or more niobium oxides and can be removed via an annealing process that can heat the quantum processor 100 to a temperature that is greater than or equal to 250° C. and less than or equal to 480° C. In one or more embodiments of the method 1100, removing the oxide layers at 1104 and 1106 can both be performed via a single etching process and/or annealing process. Removal of the one or more second oxide layers 108 can further define one or more oxide-free surfaces 202 on the quantum processor 100. Additionally, in various embodiments oxide layers can be removed (e.g., via the one or more etching processes and/or annealing processes) from one or more superconducting qubits 602 positioned on the silicon substrate 104.

At 1108, the method 1100 can comprise depositing one or more adhesion layers 402 onto the one or more superconducting resonators 102 and/or the silicon substrate 104, which can be comprised within the quantum processor 100, wherein the one or more superconducting resonators 102 can be positioned on the silicon substrate 104, and wherein the one or more adhesion layers 402 can comprise a chemical compound having a thiol functional group. For example, the depositing at 1108 can be performed in accordance with the fourth stage of manufacturing described herein. For instance, the surface of the quantum processor 100 can be oxide-free (e.g., oxide-free surface 202). Further, the one or more chemical compounds of the one or more adhesion layers 402 can comprise one or more thiol end groups that can adhere to the oxide-free surface 202 of the quantum processor 100. Example chemical compounds that can be comprised within the one or more adhesion layers 402 can include, but are not limited to: MBA, 4-aminothiophenol, glycidopropanethiol, a combination thereof, and/or the like.

At 1110, the method 1100 can comprise depositing one or more metal fluoride layers 502 onto the one or more adhesion layers 402 to encapsulate the one or more superconducting resonators 102, wherein the one or more metal fluoride layers 502 can comprise at least one member selected from the group consisting of calcium fluoride, lithium fluoride, manganese fluoride, iron fluoride, cobalt fluoride, nickel fluoride, and/or copper fluoride. For example, the depositing at 1110 can be performed in accordance with the fifth stage of manufacturing described herein. For instance, one or more metal fluoride layers 502 can cover the one or more oxide-free surfaces 202 of the quantum processor 100; thereby inhibiting the regrowth of one or more oxide layers and reducing RF absorption by the quantum processor 100.

Figure 12:
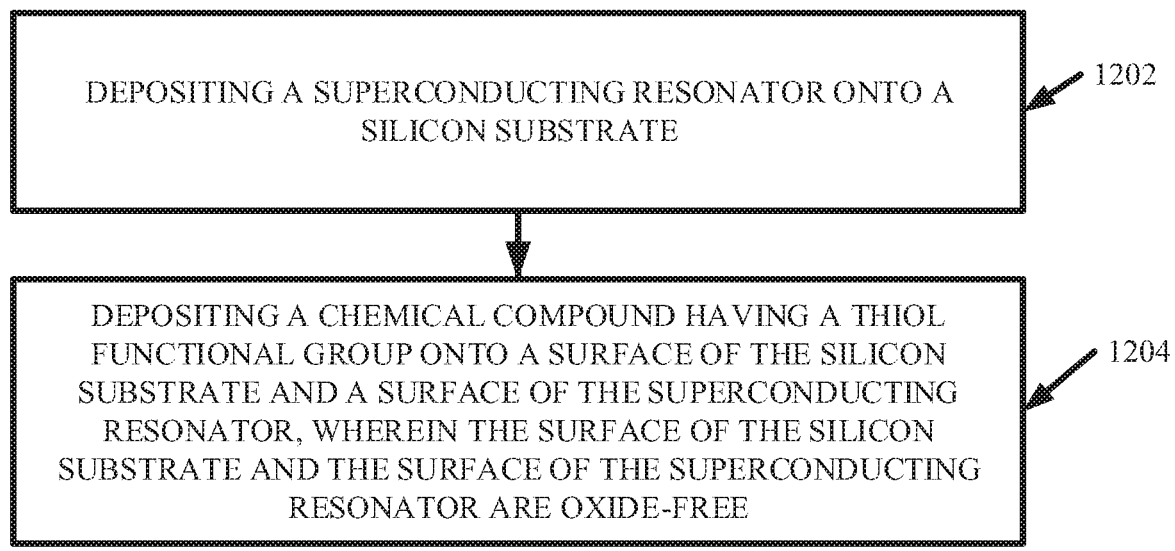
FIG. 12 illustrates a flow diagram of an example, non-limiting method that can facilitate manufacturing one or more metal fluoride encapsulated quantum processors in accordance with one or more embodiments described herein.

FIG. 12 illustrates a flow diagram of an example, non-limiting method 1200 that can facilitate manufacturing one or more quantum processors 100 that can comprise one or more adhesion layers 402 that can facilitate one or more superconducting device encapsulations with metal fluoride in accordance with one or more embodiments described herein. Repetitive description of like elements employed in other embodiments described herein is omitted for sake of brevity.

At 1202, the method 1200 can comprise depositing one or more superconducting resonators 102 onto a silicon substrate 104. As described herein, the one or more superconducting resonators 102 and/or the silicon substrate 104 can be comprised within a quantum processor 100. Further, one or more superconducting qubits 602 (e.g., comprising one or more Josephson junctions) can be positioned on the silicon substrate 104 and/or coupled to the one or more superconducting resonators 102. In various embodiments, the one or more superconducting resonators 102 can traverse a device surface of the silicon substrate 104 connecting one or more of the superconducting qubits 602. For example, the depositing at 1202 can be performed in accordance with the first stage of manufacturing described herein.

At 1204, the method 1200 can comprise depositing one or more chemical compounds having a thiol functional group onto one or more surfaces of the silicon substrate 104 and one or more surfaces of the one or more superconducting resonators 102, wherein the one or more surfaces of the silicon substrate 104 and/or of the one or more superconducting resonators 102 can be oxide-free. For example, the depositing at 1204 can be performed in accordance with the second, third, and/or fourth stages of manufacturing described herein. For instance, one or more oxide layers (e.g., first oxide layers 106 and/or second oxide layers 108) can be removed from the silicon substrate 104 and/or one or more superconducting resonators 102 to define one or more oxide-free surfaces 202. In various embodiments, removal of the oxide layers can be performed via one or more etching processes and/or annealing processes, as described herein. Further, the one or more adhesion layers 402 can be deposited onto the one or more oxide-free surfaces 202 via one or more deposition processes, wherein a thiol end group of the one or more chemical compounds can adhere to the one or more oxide-free surfaces 202 and/or promote further adhesion with one or more metal fluoride layers subsequently deposited onto the quantum processor 100.

In one or more embodiments, the one or more adhesion layers 402 can enhance an adhesion between one or more components of the quantum processor 100 (e.g., the silicon substrate 104, the one or more superconducting resonators 102, and/or the one or more superconducting qubits 602) and a metal fluoride coating. For instance, the metal fluoride coating can prevent the regrowth of one or more oxides on the quantum processor 100, and/or the one or more adhesion layers 402 can enable uniform, or near uniform, distribution of the metal fluoride coating across the quantum processor 100, as described herein.

Figure 13:
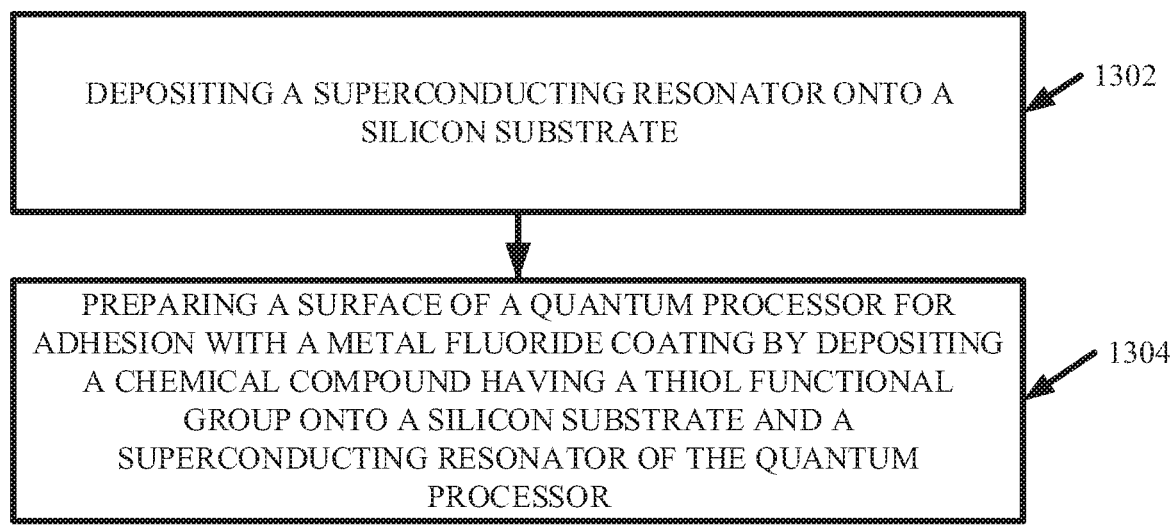
FIG. 13 illustrates a flow diagram of an example, non-limiting method that can facilitate manufacturing one or more metal fluoride encapsulated quantum processors in accordance with one or more embodiments described herein.

FIG. 13 illustrates a flow diagram of an example, non-limiting method 1300 that can facilitate manufacturing one or more quantum processors 100 that can comprise one or more adhesion layers 402 that can facilitate one or more superconducting device encapsulations with metal fluoride in accordance with one or more embodiments described herein. Repetitive description of like elements employed in other embodiments described herein is omitted for sake of brevity.

At 1302, the method 1300 can comprise depositing one or more superconducting resonators 102 onto a silicon substrate 104. As described herein, the one or more superconducting resonators 102 and/or the silicon substrate 104 can be comprised within a quantum processor 100. Further, one or more superconducting qubits 602 (e.g., comprising one or more Josephson junctions) can be positioned on the silicon substrate 104 and/or coupled to the one or more superconducting resonators 102. In various embodiments, the one or more superconducting resonators 102 can traverse a device surface of the silicon substrate 104 connecting one or more of the superconducting qubits 602. For example, the depositing at 1302 can be performed in accordance with the first stage of manufacturing described herein.

At 1304, the method 1300 can comprise preparing a surface of a quantum processor 100 for adhesion with a metal fluoride coating by depositing a chemical compound having a thiol function group onto a silicon substrate 104 and/or a superconducting resonator 102 of the quantum processor 100. For example, the preparing at 1304 can be performed in accordance with the second, third, and/or fourth stages of manufacturing described herein. For instance, in various embodiments the chemical compound can be comprised within one or more adhesion layers 402 deposited onto oxide-free surfaces 202 of the quantum processor 100 (e.g., coating one or more portions of the silicon substrate 104, superconducting resonators 102, and/or superconducting qubits 602 of the quantum processor 100). Further, the metal fluoride coating can be deposited onto the one or more adhesion layers 402 to protect and/or encapsulate one or more superconducting resonators 102 and/or superconducting qubits 602 on the silicon substrate 104. In various embodiments, the one or more chemical compounds of the one or more adhesion layers 402 can enhance adhesion and/or coverage of the metal fluoride coating on the quantum processor 100.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
depositing an adhesion layer onto a superconducting resonator and a silicon substrate that are comprised within a quantum processor, wherein the superconducting resonator is positioned on the silicon substrate, and wherein the adhesion layer comprises a chemical compound having a thiol functional group.

2. The method of claim 1, wherein the adhesion layer comprises at least one organic thiol chemical compound selected from the group consisting of 4-mercaptobenzoic acid, 4-aminothiophenol, and glycidopropanethiol.

3. The method of claim 1, wherein the adhesion layer is a self-assembled monolayer of an organic thiol chemical compound.

4. The method of claim 1, further comprising:
removing a first oxide layer from the silicon substrate via an etching process; and
removing a second oxide layer from the superconducting resonator via a process selected from the group consisting of an annealing process and the etching process.

5. The method of claim 4, wherein a qubit is further positioned on the silicon substrate and coupled to the superconducting resonator, and wherein the method further comprises removing a third oxide layer from the qubit via the etching process.

6. The method of claim 1, further comprising:
depositing a metal fluoride layer onto the adhesion layer to encapsulate the superconducting resonator, wherein the metal fluoride layer comprises at least one member selected from the group consisting of calcium fluoride, lithium fluoride, manganese fluoride, iron fluoride, cobalt fluoride, nickel fluoride, and copper fluoride.

7. The method of claim 6, wherein the depositing comprises depositing the metal fluoride layer onto the adhesion layer via thermal evaporation.

8. A method, comprising:
depositing a chemical compound having a thiol functional group onto a surface of a silicon substrate and a surface of a superconducting resonator, wherein the surface of the silicon substrate and the surface of the superconducting resonator are oxide-free.

9. The method of claim 8, wherein the chemical compound is comprised within an adhesion layer that promotes adhesion between a metal fluoride coating and at least one surface selected from the group consisting of the surface of the silicon substrate and the surface of the superconducting resonator.

10. The method of claim 8, further comprising:
removing a first oxide layer from the surface of the silicon substrate via an etching process; and
removing a second oxide layer from the surface of the superconducting resonator via at least one process selected from the group consisting of an annealing process and the etching process.

11. The method of claim 8, further comprising:
encapsulating the superconducting resonator with a metal fluoride coating, wherein the metal fluoride coating comprises at least one member selected from the group consisting of calcium fluoride, lithium fluoride, manganese fluoride, iron fluoride, cobalt fluoride, nickel fluoride, and copper fluoride.

12. A method, comprising:
preparing a surface of a quantum processor for adhesion with a metal fluoride coating by depositing a chemical compound having a thiol functional group onto a silicon substrate and a superconducting resonator of the quantum processor.

13. The method of claim 12, further comprising:
removing a first oxide layer from the silicon substrate via an etching process; and
removing a second oxide layer from the superconducting resonator via a process selected from the group consisting of an annealing process and the etching process.

14. The method of claim 12, wherein the chemical compound is selected from the group consisting of 4-mercaptobenzoic acid, 4-aminothiophenol, and glycidopropanethiol, and wherein the metal fluoride coating comprises at least one member selected from the group consisting of calcium fluoride, lithium fluoride, manganese fluoride, iron fluoride, cobalt fluoride, nickel fluoride, and copper fluoride.

15. The method of claim 13, wherein the preparing further comprises depositing the chemical compound onto a qubit of the quantum processor, and wherein the method further comprises removing a third oxide layer from the qubit via the etching process.

16. An apparatus, comprising:
an adhesion layer positioned on a superconducting resonator that is located on a surface of a silicon substrate, wherein the superconducting resonator and the silicon substrate are comprised within a quantum processor, and wherein the adhesion layer comprises a chemical compound having a thiol functional group.

17. The apparatus of claim 16, further comprising:
a metal fluoride layer that encapsulates the superconducting resonator, wherein the adhesion layer is between the metal fluoride layer and the superconducting resonator.

18. The apparatus of claim 17, wherein the chemical compound is selected from the group consisting of 4-mercaptobenzoic acid, 4-aminothiophenol, and glycidopropanethiol, and wherein the metal fluoride layer comprises at least one member selected from the group consisting of calcium fluoride, lithium fluoride, manganese fluoride, iron fluoride, cobalt fluoride, nickel fluoride, and copper fluoride.

19. The apparatus of claim 16, wherein the adhesion layer coats a surface of the superconducting resonator and the surface of the silicon substrate, and wherein the surface of the silicon substrate and the surface of the superconducting resonator of the superconducting resonator are oxide-free.

20. An apparatus, comprising:
   an adhesion layer positioned between a superconducting resonator and a metal fluoride layer, wherein the superconducting resonator is positioned on a silicon substrate within a quantum processor.

21. The apparatus of claim 20, wherein the adhesion layer comprises a chemical compound having a thiol functional group.

22. The apparatus of claim 21, wherein the chemical compound is selected from the group consisting of 4-mercaptobenzoic acid, 4-aminothiophenol, and glycidopropanethiol, and wherein the metal fluoride layer comprises at least one member selected from the group consisting of calcium fluoride, lithium fluoride, manganese fluoride, iron fluoride, cobalt fluoride, nickel fluoride, and copper fluoride.

23. The apparatus of claim 20, wherein the adhesion layer is further positioned between the metal fluoride layer and the silicon substrate.

24. The apparatus of claim 20, wherein the metal fluoride layer and the adhesion layer encapsulate the superconducting resonator on the silicon substrate.

25. The apparatus of claim 20, wherein a surface of the superconducting resonator that is adjacent to the adhesion layer is oxide-free.

* * * * *